(12) United States Patent
Shih et al.

(10) Patent No.: US 8,728,949 B2
(45) Date of Patent: May 20, 2014

(54) METHOD FOR FABRICATING A SEMICONDUCTOR DEVICE

(75) Inventors: Hung-Ling Shih, Chiaya County (TW); Shin-Chi Chen, Penghu County (TW); Chieh-Te Chen, Kaohsiung (TW); Wei-Hang Huang, Kaohsiung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 300 days.

(21) Appl. No.: 12/853,284

(22) Filed: Aug. 9, 2010

(65) Prior Publication Data

US 2012/0034780 A1  Feb. 9, 2012

(51) Int. Cl.
*H01L 21/302* (2006.01)

(52) U.S. Cl.
USPC ........... 438/723; 438/692; 438/725; 438/736; 216/81

(58) Field of Classification Search
USPC ......... 438/692, 693, 714, 723, 735, 736, 740, 438/218, 221, 691, 706, 725; 216/79, 80, 216/58, 81
See application file for complete search history.

(56) References Cited

U.S. PATENT DOCUMENTS

| | | | |
|---|---|---|---|
| 6,251,721 B1 * | 6/2001 | Kanazawa et al. | 438/240 |
| 6,380,106 B1 | 4/2002 | Lim | |
| 7,067,379 B2 * | 6/2006 | Wen et al. | 438/300 |
| 7,563,702 B2 | 7/2009 | Nam | |
| 8,030,150 B2 * | 10/2011 | Kwon et al. | 438/201 |
| 2004/0253788 A1 * | 12/2004 | Adachi et al. | 438/257 |
| 2005/0255654 A1 * | 11/2005 | Lee et al. | 438/264 |
| 2008/0179715 A1 * | 7/2008 | Coppa | 257/647 |
| 2010/0133420 A1 * | 6/2010 | Ogino | 250/227.2 |

* cited by examiner

*Primary Examiner* — Lan Vinh
(74) *Attorney, Agent, or Firm* — Winston Hsu; Scott Margo

(57) ABSTRACT

A method for forming a semiconductor device. A substrate having thereon at least one small pattern and at least one large pattern is provided. A sacrificial layer is deposited to cover the small pattern and the large pattern. A chemical mechanical polishing is performed to planarize the sacrificial layer. The sacrificial layer is then dry etched to a thickness that is smaller than a height of the small pattern and the large pattern, thereby revealing an oxide hard mask of the small pattern and the large pattern. The oxide hard mask is then selectively removed.

17 Claims, 3 Drawing Sheets

METHOD FOR FABRICATING A SEMICONDUCTOR DEVICE

BACKGROUND OF THE INVENTION

1. Field of the Invention

The present invention relates generally to semiconductor technology. More particularly, the present invention relates to a method for fabricating a semiconductor device such as a metal-oxide-semiconductor (MOS) transistor.

2. Description of the Prior Art

Advances in the semiconductor process technologies have dramatically decreased the device feature size and increased the circuit density and performance on integrated circuit chips.

As known in the art, a gate stack or multilayer structure is used as gate electrodes or interconnects in MOS and CMOS integrated circuits. One gate stack that has been proposed consists of doped polysilicon layer and oxide cap layer. The oxide cap layer is patterned and used as a hard mask to subsequently etch the underlying polysilicon layer. After the gate stack is patterned in this manner, the oxide cap layer is temporarily retained in the gate structure. In a later stage, the oxide cap layer is removed to expose the underlying doped polysilicon layer.

A so-called photoresist (PR) approach is typically used in the oxide cap layer removal process for preventing STI (shallow trench isolation) loss. According to this approach, prior to the removal of the oxide mask layer, a layer of photoresist is coated over the substrate surface including the oxide define area and trench isolation region. The photoresist layer is then etched back to reveal the oxide cap layer. One problem associated with this PR approach is that the photoresist layer has serious thickness loading effect between a small pattern such as an isolated gate pattern and a large pattern such as a pad pattern. That is, a thickness of the photoresist layer directly above the large pattern is much greater than that above the small pattern.

Therefore, a need exists for an improved method for forming a semiconductor device such as a metal-oxide-semiconductor (MOS) transistor having a gate structure using oxide cap layer as hard mask, which allows for improved manufacturability and yield.

SUMMARY OF THE INVENTION

To address these and other objects and in view of its purposes, the present invention provides a method for forming a semiconductor device, comprising the steps of: providing a substrate having thereon at least one small pattern and at least one large pattern; depositing a sacrificial layer having a first thickness over the substrate to cover the small pattern and the large pattern; chemical mechanical polishing the sacrificial layer to a second thickness; dry etching the sacrificial layer to a third thickness that is smaller than a height of the small pattern and the large pattern, thereby revealing an oxide hard mask of the small pattern and the large pattern; selectively removing the oxide hard mask; and completely removing the sacrificial layer.

According to another aspect, the invention provides a method for forming a semiconductor device, comprising the steps of: providing a substrate having thereon at least one gate structure; depositing a sacrificial layer having a first thickness over the substrate to cover the gate structure; chemical mechanical polishing the sacrificial layer to a second thickness; dry etching the sacrificial layer to a third thickness that is smaller than a height of the gate structure, thereby revealing a hard mask of the gate structure; removing the hard mask; and completely removing the sacrificial layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
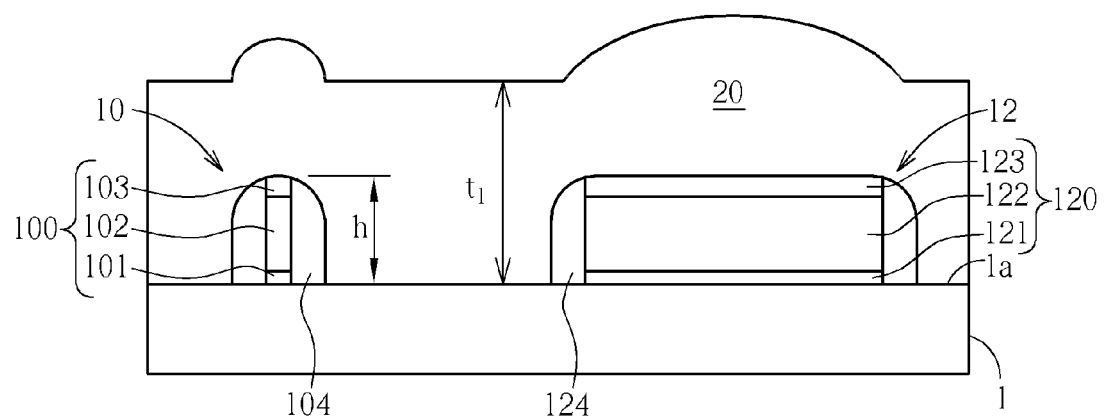
FIGS. 1-4 are schematic, cross-sectional diagrams illustrating a method for forming a semiconductor device such as a metal-oxide-semiconductor (MOS) transistor having a gate structure using oxide cap layer as hard mask in accordance with one embodiment of this invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The present invention, in one aspect, pertains to an improved method for selectively removing the silicon oxide hard mask from the gate stack of transistor devices without loading effect between small pattern and large pattern. The following detailed description is, therefore, not to be taken in a limiting sense, and the scope of the present invention is defined only by the appended claims, along with the full scope of equivalents to which such claims are entitled.

FIGS. 1-4 are schematic, cross-sectional diagrams illustrating a method for forming a semiconductor device such as a metal-oxide-semiconductor (MOS) transistor having a gate structure using oxide cap layer as hard mask in accordance with one embodiment of this invention. As shown in FIG. 1, a substrate 1 is provided. The substrate 1 may be a semiconductor substrate such as a silicon substrate. However, it is understood that other semiconductor substrates such as epitaxial silicon, SiGe or the like may be employed without departing from the spirit of this invention.

On the main surface 1a of the substrate 1, at least one small pattern 10 such as an isolated gate structure and at least one large pattern 12 such as a pad structure. According to the embodiment, the pad structure 12 occupies a surface area that is much greater than the gate structure 10. The gate structure 10 includes a gate stack 100 comprising a gate dielectric layer 101 on the main surface 1a of the substrate 1, a conductive layer 102 such as doped polysilicon on the gate dielectric layer 101, and a silicon oxide hard mask layer (or oxide hard mask) 103 on the conductive layer 102. A pair of dielectric spacers 104 such as silicon nitride spacers may be provided on opposite sidewalls of the gate stack 100.

The pad structure 12 has a cross-sectional structure that is similar with that of the gate structure 10 since the gate structure 10 and the pad structure 12 are fabricated simultaneously. For example, likewise, the pad structure 12 has a similar stack 120 comprising a gate dielectric layer 121, a conductive layer 122 and a silicon oxide hard mask layer 123. The gate structure 10 and the pad structure 12 have substantially the same height h.

A sacrificial layer 20 is then formed over the main surface 1a of the substrate 1 in a blanket manner. The sacrificial layer 20 covers the gate structure 10 and the pad structure 12 and fills up the space between the gate structure 10 and the pad structure 12. The thickness t1 of the sacrificial layer 20 in the space between the gate structure 10 and the pad structure 12 is greater than the height h of the gate structure 10 and the pad structure 12.

According to the embodiment, the sacrificial layer 20 may be formed by deposition methods such as plasma-enhanced chemical vapor deposition (PECVD). Alternatively, the sacrificial layer 20 may be formed by coating methods. Preferably, in one embodiment, the sacrificial layer 20 is a non-conductive material film with PR-like ashability and offers high etch selectivity for polysilicon, nitride and oxide. For example, the sacrificial layer 20 may be carbon-based layer and may comprise amorphous carbon film such as Advanced Patterning Film™ (APF™) available from Applied Materials, Inc. of Santa Clara, Calif., or similar material.

Figure 2:
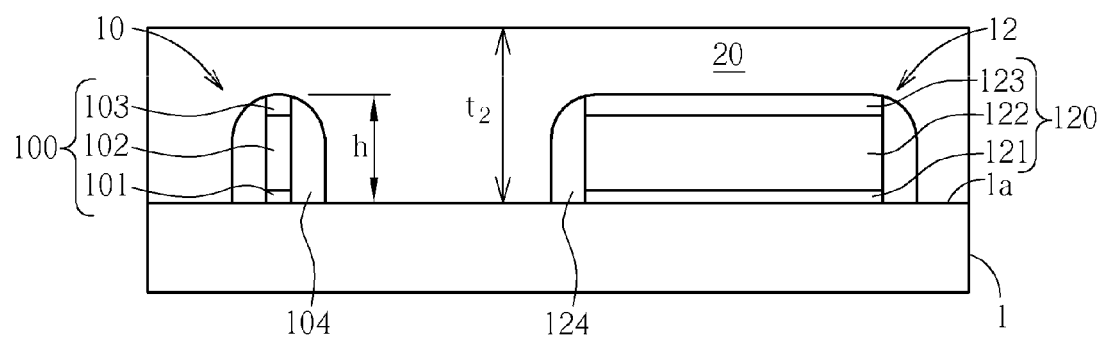

As shown in FIG. 2, according to the embodiment, after the deposition of the sacrificial layer 20, a chemical mechanical polishing (CMP) process is carried out to polish the sacrificial layer 20 to form a flat surface on the sacrificial layer 20. At this point, the sacrificial layer 20 has a post-CMP thickness t2 in the space between the gate structure 10 and the pad structure 12, which is still greater than the height h of the gate structure 10 and the pad structure 12.

Figure 3:
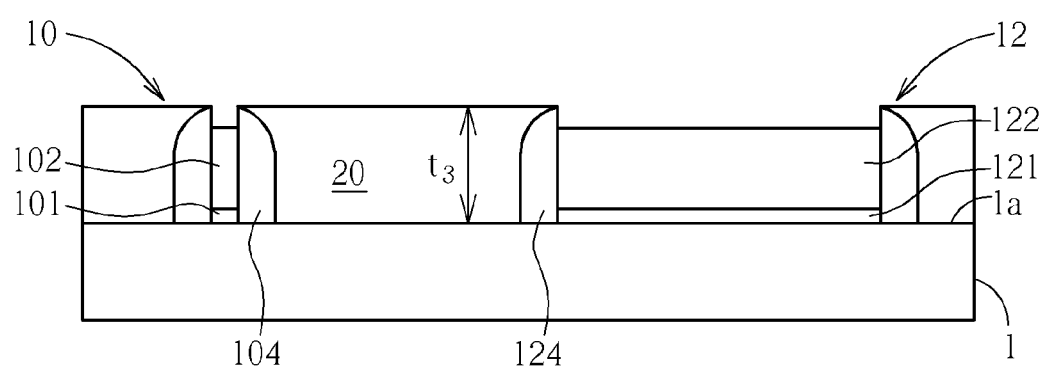

As shown in FIG. 3, after the CMP process, a dry etching process is carried out to etch away an upper portion of the remaining sacrificial layer 20 in order to reveal the silicon oxide hard mask layer 103 and the silicon oxide hard mask layer 123. At this point, the sacrificial layer 20 has a post-etch thickness t3 in the space between the gate structure 10 and the pad structure 12, which is slightly smaller than the height h of the gate structure 10 and the pad structure 12.

Figure 4:
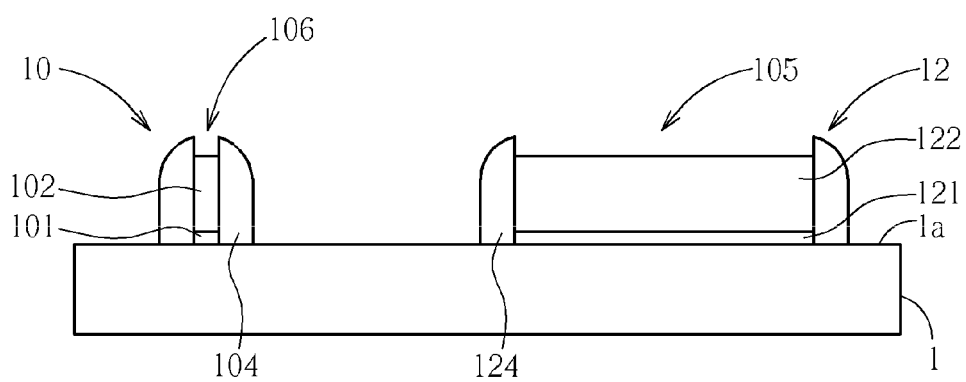

As shown in FIG. 4, after the dry etching process, the silicon oxide hard mask layer 103 and the silicon oxide hard mask layer 123 are removed to form a recess 105 and a recess 106 by methods known in the art, for example, wet or dry etching methods. The underlying conductive layer 102 and conductive layer 122 are exposed after the silicon oxide hard mask layer 103 and the silicon oxide hard mask layer 123 are removed. It is noteworthy that when removing the silicon oxide hard mask layer 103 and the silicon oxide hard mask layer 123, the shallow trench isolation region between the gate structure 10 and the pad structure 12 is still covered with and protected by the sacrificial layer 20. Thereafter, the sacrificial layer 20 is stripped or ashed by $O_2$ plasma or $O_2/CF_4$ plasma in the presence of the recesses 105, 106.

Those skilled in the art will readily observe that numerous modifications and alterations of the device and method may be made while retaining the teachings of the invention.

What is claimed is:

1. A method for forming a semiconductor device, comprising the steps of:
    providing a substrate having thereon at least one small pattern and at least one large pattern;
    depositing a sacrificial layer having a first thickness over the substrate to cover the small pattern and the large pattern;
    chemical mechanical polishing the sacrificial layer to a second thickness;
    dry etching the sacrificial layer to a third thickness that is smaller than a height of the small pattern and the large pattern, thereby revealing an oxide hard mask of the small pattern and the large pattern;
    removing the oxide hard mask completely; and
    completely removing the sacrificial layer disposed over the substrate.

2. The method according to claim 1 wherein the sacrificial layer comprises an amorphous carbon film.

3. The method according to claim 1 wherein the second thickness is greater than the height of the small pattern and the large pattern.

4. The method according to claim 1 wherein the sacrificial layer is removed by $O_2$ plasma or $O_2/CF_4$ plasma.

5. The method according to claim 1, wherein the oxide hard mask is removed to form a recess, and the sacrificial layer is completely removed in the presence of the recess.

6. The method according to claim 1 wherein the small pattern comprises an isolated gate structure.

7. The method according to claim 6 wherein the gate structure includes a gate stack comprising a gate dielectric layer on the substrate, a conductive layer on the gate dielectric layer, and the oxide hard mask on the conductive layer.

8. The method according to claim 6 wherein the large pattern comprises a pad structure.

9. The method according to claim 8 wherein the pad structure occupies a surface area that is much greater than the gate structure.

10. A method for forming a semiconductor device, comprising the steps of:
    providing a substrate having thereon at least one gate structure;
    depositing a sacrificial layer having a first thickness over the substrate to cover the gate structure;
    chemical mechanical polishing the sacrificial layer to a second thickness;
    dry etching the sacrificial layer to a third thickness that is smaller than a height of the gate structure, thereby revealing a hard mask of the gate structure;
    removing the hard mask completely; and
    completely removing the sacrificial layer disposed over the substrate.

11. The method according to claim 10 wherein the gate structure is an isolated gate structure.

12. The method according to claim 10 wherein the gate structure includes a gate stack comprising a gate dielectric layer on the substrate, a conductive layer on the gate dielectric layer, and the hard mask on the conductive layer.

13. The method according to claim 10 wherein the hard mask comprises silicon oxide.

14. The method according to claim 10 wherein the sacrificial layer comprises an amorphous carbon film.

15. The method according to claim 10 wherein the second thickness is greater than the height of the gate structure.

16. The method according to claim 10 wherein the sacrificial layer is removed by $O_2$ plasma or $O_2/CF_4$ plasma.

17. The method according to claim 10, wherein the hard mask is removed to form a recess, and the sacrificial layer is completely removed in the presence of the recess.

* * * * *